(12) United States Patent
Yoneda et al.

(10) Patent No.: US 11,890,853 B2
(45) Date of Patent: Feb. 6, 2024

(54) RESIN LAYERED PRODUCT, DIELECTRIC LAYER, METAL FOIL WITH RESIN, CAPACITOR ELEMENT, AND PRINTED WIRING BOARD WITH BUILT-IN CAPACITOR

(71) Applicant: MITSUI MINING & SMELTING CO., LTD., Tokyo (JP)

(72) Inventors: Yoshihiro Yoneda, Ageo (JP); Toshihiro Hosoi, Ageo (JP); Tetsuro Sato, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 0 days.

(21) Appl. No.: 17/795,376

(22) PCT Filed: Jan. 19, 2021

(86) PCT No.: PCT/JP2021/001625
§ 371 (c)(1),
(2) Date: Jul. 26, 2022

(87) PCT Pub. No.: WO2021/153339
PCT Pub. Date: Aug. 5, 2021

(65) Prior Publication Data
US 2023/0107922 A1    Apr. 6, 2023

(30) Foreign Application Priority Data
Jan. 28, 2020 (JP) .................................. 2020-011799

(51) Int. Cl.
*B32B 7/025*    (2019.01)
*B32B 15/08*    (2006.01)
(Continued)

(52) U.S. Cl.
CPC .............. *B32B 7/025* (2019.01); *B32B 15/08* (2013.01); *B32B 15/20* (2013.01); *B32B 27/281* (2013.01);
(Continued)

(58) Field of Classification Search
CPC ......... B32B 7/025; B32B 15/08; B32B 15/20; B32B 27/281; B32B 27/38;
(Continued)

(56) References Cited

U.S. PATENT DOCUMENTS

2006/0183872 A1 * 8/2006 Lee ........................ H01G 4/206
428/413
2008/0230261 A1 * 9/2008 Tanaka .................... B32B 27/34
174/258
2020/0362169 A1    11/2020 Yoneda et al.

FOREIGN PATENT DOCUMENTS

EP    1 422 055 A1    5/2004
JP    2003-039595 A    2/2003
(Continued)

*Primary Examiner* — John D Freeman
(74) *Attorney, Agent, or Firm* — GREENBLUM & BERNSTEIN, P.L.C.

(57) ABSTRACT

There is provided a resin laminate including a first layer composed of a first resin composition and a second layer composed of a second resin composition. The first resin composition includes a resin component including an epoxy resin, a diamine compound, and a polyimide resin, and a complex metal oxide including at least two selected from Ba, Ti, etc. of 60 to 85 parts by weight based on 100 parts of the first resin composition, and the content of the polyimide resin is 20 to 60 parts by weight based on 100 parts of the resin component. The second resin composition includes a resin component including an epoxy resin and a diamine compound but is free of polyimide resin, and a complex metal oxide including at least two selected from
(Continued)

Ba, Ti, etc. of 70 to 90 parts by weight based on 100 parts of the second resin composition.

18 Claims, 4 Drawing Sheets

(51) Int. Cl.
    *B32B 15/20*     (2006.01)
    *B32B 27/28*     (2006.01)
    *B32B 27/38*     (2006.01)

(52) U.S. Cl.
    CPC .......... *B32B 27/38* (2013.01); *B32B 2250/02* (2013.01); *B32B 2255/06* (2013.01); *B32B 2264/102* (2013.01); *B32B 2307/204* (2013.01); *B32B 2311/12* (2013.01); *B32B 2457/08* (2013.01); *B32B 2457/16* (2013.01)

(58) Field of Classification Search
    CPC ............ B32B 2250/02; B32B 2255/06; B32B 2264/102; B32B 2307/204; B32B 2311/12; B32B 2457/08; B32B 2457/16; B32B 2255/26; B32B 15/043; B32B 27/20; B32B 27/08; B32B 2270/00; B32B 2309/105; H01G 4/18; H05K 1/16; H05K 3/46
    See application file for complete search history.

(56) References Cited

FOREIGN PATENT DOCUMENTS

| | | | |
|---|---|---|---|
| JP | 2006-165400 A | 6/2006 | |
| WO | WO-2007097585 A1 * | 8/2007 | ............ B32B 15/08 |
| WO | 2019/150994 A1 | 8/2019 | |

* cited by examiner

RESIN LAYERED PRODUCT, DIELECTRIC LAYER, METAL FOIL WITH RESIN, CAPACITOR ELEMENT, AND PRINTED WIRING BOARD WITH BUILT-IN CAPACITOR

TECHNICAL FIELD

The present invention relates to a resin laminate, a dielectric layer, a resin-coated metal foil, a capacitor element, and a capacitor-built-in printed wiring board.

BACKGROUND ART

As a resin composition used for the manufacture of a copper-clad laminate or a printed wiring board, a resin composition for a capacitor-built-in printed wiring board is known. Such a resin composition functions as a dielectric layer in a capacitor by being cured. For example, Patent Literature 1 (WO2019/150994A1) discloses a resin composition including a resin component including an epoxy resin, a diamine compound, and a polyimide resin, and a dielectric filler being a complex metal oxide including at least two selected from the group consisting of Ba, Ti, Sr, Pb, Zr, La, Ta, and Bi, in an amount of 60 parts by weight or more and 85 parts by weight or less based on 100 parts by weight of the solids of the resin composition. This literature states that when the resin composition is used as the dielectric layer of a capacitor, capacitance decrease or dielectric constant decrease at high temperature can be suppressed while excellent dielectric properties and circuit adhesion are ensured.

In addition, there is known a capacitor using as a dielectric layer a resin laminate including a plurality of resin composition layers. For example, Patent Literature 2 (JP2003-039595A) discloses a double-sided copper-clad laminate for capacitor layer formation including a resin layer being a dielectric, and copper foil layers being electrical conductors provided on both surfaces of the resin layer, and states that the resin layer includes a three-layer structure being thermosetting resin layer/heat-resistant film layer/thermosetting resin layer and that the heat-resistant film layer has normal state properties of a Young's modulus of 300 kg/mm$^2$ or more, a tensile strength of 20 kg/mm$^2$ or more, and a tensile elongation rate of 5% or more. It is stated that according to this double-sided copper-clad laminate, when a high voltage of 500 V or more is applied between the copper foil surfaces, the occurrence of discharge between the roughening-treated portions of the facing copper foils can be reliably prevented. Further, Patent Literature 3 (JP2006-165400A) describes a method for manufacturing a capacitor layer-forming material for forming a capacitor layer of a printed wiring board, including electrically conductive layers located at outer layers on both surfaces, and a dielectric layer having a thermosetting polymer layer/polymerization reaction layer/thermosetting polymer layer three-layer structure in the form of being sandwiched between the electrically conductive layers.

CITATION LIST

Patent Literature

Patent Literature 1: WO2019/150994A1
Patent Literature 2: JP2003-039595A
Patent Literature 3: JP2006-165400A

SUMMARY OF INVENTION

Printed wiring boards are widely used in electronic communication equipment such as portable electronic equipment. Particularly, with the weight and size reduction and high functionalization of portable electronic communication equipment and the like in recent years, the reduction of noise in printed wiring boards, and the like have been problems. In order to allow noise reduction, a capacitor is important, and in order to achieve performance enhancement, for such a capacitor, miniaturization and thinning to the extent that it is incorporated into an inner layer of a printed wiring board are desired. In this respect, a dielectric layer composed of the resin composition disclosed in Patent Literature 1 (WO2019/150994A1) provides good performance to some extent, but further improvement of capacitance is desired. On the other hand, ensuring the adhesion between the resin layer and a circuit (that is, circuit adhesion), voltage endurance, and interlayer insulation reliability is also desired.

The present inventors have now discovered that by using, as the dielectric layer of a capacitor, a resin laminate including a first layer composed of a predetermined first resin composition and a second layer composed of a predetermined second resin composition, good circuit adhesion, voltage endurance, and interlayer insulation reliability can be ensured while dielectric properties such as capacitance are improved.

Thus, it is an object of the present invention to provide a resin laminate that can ensure good circuit adhesion, voltage endurance, and interlayer insulation reliability, while improving dielectric properties, when used as the dielectric layer of a capacitor.

According to an aspect of the present invention, there is provided a resin laminate comprising a first layer composed of a first resin composition and a second layer composed of a second resin composition provided on one surface of the first layer,
  wherein the first resin composition comprises
    a resin component comprising an epoxy resin, a diamine compound, and a polyimide resin, and
    a dielectric filler being a complex metal oxide comprising at least two selected from the group consisting of Ba, Ti, Sr, Pb, Zr, La, Ta, and Bi, in an amount of 60 parts by weight or more and 85 parts by weight or less based on 100 parts by weight of solids of the first resin composition,
  wherein the content of the polyimide resin in the first resin composition is 20 parts by weight or more and 60 parts by weight or less based on 100 parts by weight of the resin component, and
  wherein the second resin composition comprises
    a resin component which comprises an epoxy resin and a diamine compound but is free of polyimide resin, and
    a dielectric filler being a complex metal oxide comprising at least two selected from the group consisting of Ba, Ti, Sr, Pb, Zr, La, Ta, and Bi, in an amount of 70 parts by weight or more and 90 parts by weight or less based on 100 parts by weight of solids of the second resin composition.

According to another aspect of the present invention, there is provided a dielectric layer comprising the resin laminate, wherein the first resin composition and the second resin composition are cured.

According to another aspect of the present invention, there is provided a resin-coated metal foil comprising a metal foil and the resin laminate provided on at least one surface of the metal foil.

According to another aspect of the present invention, there is provided a capacitor element comprising the dielectric layer.

According to another aspect of the present invention, there is provided a capacitor-built-in printed wiring board comprising the dielectric layer.

DESCRIPTION OF EMBODIMENTS

Resin Laminate

Figure 1:
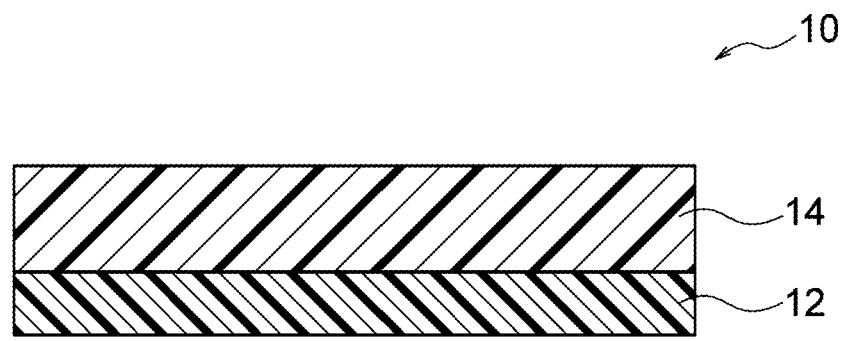
FIG. 1 is a schematic cross-sectional view showing one example of a resin laminate according to the present invention.

The resin laminate 10 of the present invention is schematically shown in FIG. 1. The resin laminate 10 includes a first layer 12 and a second layer 14 provided on one surface of the first layer 12. The first layer 12 is composed of a first resin composition. The first resin composition includes a resin component and a dielectric filler. This resin component includes an epoxy resin, a diamine compound, and a polyimide resin. The dielectric filler of the first resin composition is a complex metal oxide including at least two selected from the group consisting of Ba, Ti, Sr, Pb, Zr, La, Ta, and Bi and is included in the first resin composition in an amount of 60 parts by weight or more and 85 parts by weight or less based on 100 parts by weight of the solids of the first resin composition. The content of the polyimide resin in the first resin composition is 20 parts by weight or more and 60 parts by weight or less based on 100 parts by weight of the resin component. On the other hand, the second layer 14 is composed of a second resin composition. The second resin composition includes a resin component and a dielectric filler. This resin component includes an epoxy resin and a diamine compound but is free of polyimide resin. The dielectric filler of the second resin composition is a complex metal oxide including at least two selected from the group consisting of Ba, Ti, Sr, Pb, Zr, La, Ta, and Bi and is included in the second resin composition in an amount of 70 parts by weight or more and 90 parts by weight or less based on 100 parts by weight of the solids of the second resin composition. By using, as the dielectric layer of a capacitor, the resin laminate 10 including the first layer 12 composed of the predetermined first resin composition and the second layer 14 composed of the predetermined second resin composition, in this manner, good circuit adhesion, voltage endurance, and interlayer insulation reliability can be ensured while the dielectric properties such as capacitance are improved.

As described above, a dielectric layer composed of the resin composition disclosed in Patent Literature 1 provides good performance to some extent, but further improvement of capacitance is desired. In this respect, the capacitance can be improved by increasing the content of the dielectric filler in the resin composition, but due to the increase of the dielectric filler, the adhesion between the resin layer and a circuit (that is, circuit adhesion) decreases. Therefore, how to achieve both dielectric properties such as capacitance and circuit adhesion is a problem. Not only that, but also ensuring voltage endurance and interlayer insulation reliability when using the resin composition as the dielectric layer of a capacitor is desired for the resin composition. These problems are conveniently solved according to the resin laminate 10 of the present invention. Particularly, with the resin laminate 10 of the present invention, both dielectric properties such as capacitance and circuit adhesion, which intrinsically tend to be in a trade-off relationship, can be conveniently achieved in that the first resin composition constituting the first layer 12 is particularly excellent in circuit adhesion, and on the other hand, the second resin composition constituting the second layer 14 is particularly excellent in dielectric properties.

Therefore, the first layer 12 can be made thinner as long as it satisfies the desired circuit adhesion, and at the same time, the second layer 14 having excellent dielectric properties can be made thick to the maximum to achieve higher capacitance as the resin laminate. For example, the thickness of the first layer 12 is preferably 0.5% or more and 100% or less, more preferably 15% or more and 100% or less, further preferably 25% or more and 75% or less, and particularly preferably 35% or more and 50% or less of the thickness of the second layer 14. However, as long as the desired properties are obtained, the first layer 12 may be made thicker than the second layer 14. The thickness of the first layer 12 is preferably 0.1 μm or more and 5 μm or less, more preferably 0.1 μm or more and 3 μm or less, particularly preferably 0.1 μm or more and 2 μm or less, and most preferably 0.5 μm or more and 2 μm or less from the viewpoint of circuit adhesion. The thickness of the second layer 14 is preferably 0.1 μm or more and 25 μm or less, more preferably 0.4 μm or more and 17 μm or less, particularly preferably 0.9 μm or more and 8 μm or less, and most preferably 1 μm or more and 4 μm or less from the viewpoint of ensuring high capacitance.

Figure 2:
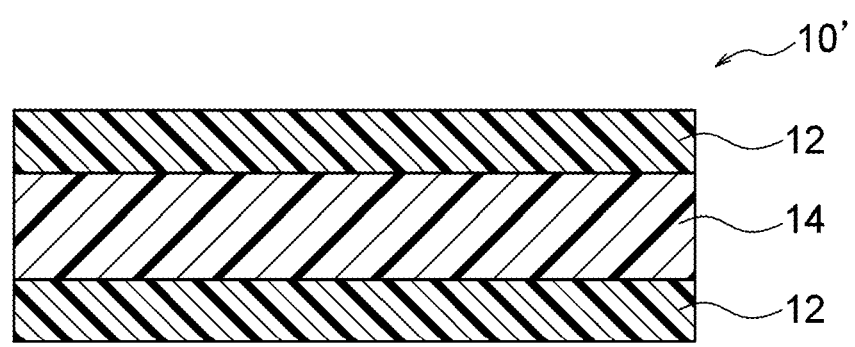
FIG. 2 is a schematic cross-sectional view showing another example of the resin laminate according to the present invention.

The resin laminate 10 may have any layer configuration as long as it includes the first layer 12 and the second layer 14. According to a preferred aspect of the present invention, the resin laminate 10 can have a two-layer configuration composed of the first layer 12 and the second layer 14, as shown in FIG. 1. Alternatively, the resin laminate 10 may have a three-layer configuration like the resin laminate 10' shown in FIG. 2. That is, according to another preferred aspect of the present invention, the resin laminate 10' may further include, on the surface of the second layer 14 on the side away from the first layer 12, another first layer 12 composed of the first resin composition. By providing such a first layer 12/second layer 14/first layer 12 three-layer configuration, improved circuit adhesion can be achieved on the surfaces of the resin laminate 10 on both sides.

The first resin composition constituting the first layer 12 includes a resin component and a dielectric filler. This resin component includes an epoxy resin, a diamine compound, and a polyimide resin. The first resin composition contributes to any of dielectric properties, circuit adhesion, voltage endurance, and interlayer insulation reliability but is particularly excellent in circuit adhesion. The first resin composition or the first layer 12 may further include any other component as long as the desired functions are not impaired.

The epoxy resin used in the first resin composition is not particularly limited as long as it has two or more epoxy groups in the molecule and can be used for electrical and electronic material applications. The preferred content of the epoxy resin in the first resin composition is 15 parts by weight or more and 80 parts by weight or less, more preferably 40 parts by weight or more and 65 parts by weight or less, and further preferably 45 parts by weight or more and 60 parts by weight or less based on 100 parts by weight of the resin component. Examples of the epoxy resin in the first resin composition include bisphenol A type epoxy resins, bisphenol F type epoxy resins, bisphenol S type epoxy resins, phenol novolac type epoxy resins, biphenyl novolac type epoxy resins, cresol novolac type epoxy resins, alicyclic epoxy resins, glycidylamine type epoxy resins, naphthalene type epoxy resins, anthracene type epoxy resins, dicyclopentadiene type epoxy resins, and any combination thereof. In terms of maintaining the heat resistance of the cured product, aromatic epoxy resins or polyfunctional epoxy resins are preferred, and bisphenol A type epoxy resins, phenol novolac type epoxy resins, naphthalene type epoxy resins, cresol novolac type epoxy resins, or biphenyl novolac type epoxy resins are more preferred.

The diamine compound used in the first resin composition is not particularly limited as long as it functions as a curing agent for the epoxy resin and has two amino groups in the molecule and can be used for electrical and electronic material applications. The preferred content of the diamine compound in the first resin composition is an amount such that the number of active hydrogen groups of the diamine compound is 0.5 or more and 1.5 or less, more preferably 0.5 or more and 1.0 or less, and further preferably 0.65 or more and 1.0 or less, based on the number of epoxy groups of the epoxy resin being 1. Here, "the number of epoxy groups of the epoxy resin" is the value obtained by dividing the mass of the solids of the epoxy resin present in the resin component by the epoxy equivalent. "The number of active hydrogen groups of the diamine compound" is the value obtained by dividing the mass of the solids of the diamine compound present in the resin component by the active hydrogen group equivalent. Examples of the diamine compound include 3,4'-diaminodiphenyl sulfide, 4,4'-diaminodiphenyl sulfide, 3,4'-diaminodiphenyl ether, 4,4'-diaminodiphenyl ether, 3,4'-diaminodiphenyl sulfone, 4,4'-diaminodiphenyl sulfone, bis[4-(4-aminophenoxy)phenyl] sulfone, bis[4-(3-aminophenoxy)phenyl] sulfone, bis(4-aminophenoxy)biphenyl, bis[4-(4-aminophenoxy)phenyl] ether, 1,4-bis(4-aminophenoxy)benzene, 1,3-bis(4-aminophenoxy)benzene, 2,2-bis[4-(4-aminophenoxy)phenyl]hexafluoropropane, 2,2-bis[4-(4-aminophenoxy)phenyl]propane, 1,3-bis(aminomethyl)cyclohexane, and any combination thereof and are preferably 4,4'-diaminodiphenyl sulfone, bis[4-(3-aminophenoxy)phenyl] sulfone, and 2,2-bis[4-(4-aminophenoxy)phenyl]propane. In the first resin composition, the total content of the epoxy resin and the diamine compound is preferably 40 parts by weight or more and 80 parts by weight or less, more preferably 50 parts by weight or more and 80 parts by weight or less, further preferably 50 parts by weight or more and 70 parts by weight or less, and particularly preferably 60 parts by weight or more and 70 parts by weight or less based on 100 parts by weight of the resin component. In the case of such a content, the circuit adhesion and the heat resistance can be improved.

The polyimide resin used in the first resin composition contributes not only to the reduction of the dielectric loss tangent but to the improvement of the circuit adhesion. The content of the polyimide resin in the first resin composition is 20 parts by weight or more and 60 parts by weight or less, preferably 20 parts by weight or more and 50 parts by weight or less, more preferably 30 parts by weight or more and 50 parts by weight or less, and further preferably 30 parts by weight or more and 40 parts by weight or less based on 100 parts by weight of the resin component. In the case of such a content, excellent dielectric properties and circuit adhesion can be exhibited while good heat resistance is ensured. The polyimide resin is not particularly limited as long as the desired dielectric properties, circuit adhesion, and heat resistance can be achieved. In terms of being able to form a varnish and a coating in which the polyimide resin is well compatibilized with the epoxy resin, a polyimide resin soluble in an organic solvent (hereinafter referred to as an organic solvent-soluble polyimide) is preferred. This organic solvent in which the polyimide resin is soluble preferably has a solubility parameter (SP value) of 7.0 or more and 17.0 or less. Preferred examples of such an organic solvent include methyl ethyl ketone, toluene, xylene, N-methylpyrrolidone, dimethylacetamide, dimethylformamide, cyclopentanone, cyclohexanone, cyclohexane, methylcyclohexane, ethylene glycol, ethylene glycol dimethyl ether, ethylene glycol acetate, and any combination thereof. Particularly, one having, at a molecular end, at least one functional group capable of reacting with an epoxy group is preferred in terms of maintaining heat resistance after curing. Specifically, the polyimide resin preferably has, as a functional group at its end or in its side chain, at least one functional group selected from the group consisting of a carboxyl group, a sulfonic acid group, a thiol group, and a phenolic hydroxyl group. When the polyimide resin has such a functional group, the organic solvent solubility and the compatibility with the epoxy resin improve while the heat resistance of the polyimide resin is maintained. Among these, a polyimide resin having a carboxyl group as a functional group at an end or in a side chain is more preferably used.

Examples of preferred organic solvent-soluble polyimides include those obtained by the imidization reaction of a tetracarboxylic dianhydride with a diamine compound. Examples of the tetracarboxylic dianhydride include 2,2-bis(3,4-dicarboxyphenyl)propane dianhydride, 2,2-bis(2,3-dicarboxyphenyl)propane dianhydride, bis(3,4-dicarboxyphenyl) sulfone dianhydride, bis(3,4-dicarboxyphenyl) ether dianhydride, 2,2-bis(3,4-dicarboxyphenyl)hexafluoropropane dianhydride, 2,2-bis[4-(3,4-dicarboxyphenyl)phenyl]propane dianhydride, pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, 1,2,5,6-naphthalenetetracarboxylic dianhydride, 2,3,6,7-naphthalenetetracarboxylic dianhydride, 2,3,5,6-pyridinetetracarboxylic dianhydride, and 3,4,9,10-perylenetetracarboxylic dianhydride, or compounds having a substituent, an alkyl group or a halogen atom, on these aromatic rings, and any combination thereof. Among these, a polyimide resin mainly including 2,2-bis(3,4-dicarboxyphenyl)hexafluoropropane dianhydride, 2,2-bis[4-(3,4-dicarboxyphenyl)phenyl]propane dianhydride, 2,3,3',4'-biphenyltetracarboxylic dianhydride, or 2,2',3,3'-biphenyltetracarboxylic dianhydride is preferred in terms of improving the heat resistance of the resin composition. On the other hand, examples of the diamine compound include those as described above.

The dielectric filler used in the first resin composition is a component that provides the desired high capacitance to the resin laminate as a dielectric layer, and is a complex metal oxide including at least two selected from the group consisting of Ba, Ti, Sr, Pb, Zr, La, Ta, and Bi. Preferred examples of the complex metal oxide include particles including at least one selected from the group consisting of $BaTiO_3$, $SrTiO_3$, $Pb(Zr,Ti)O_3$, $PbLaTiO_3$, $PbLaZrO$, and $SrBi_2Ta_2O_9$, which have high capacitance and can be mixed into the first resin composition, more preferably $BaTiO_3$. $Pb(Zr,Ti)O_3$ means $Pb(Zr_xTi_{1-x})O_3$, wherein $0 \leq x \leq 1$, typically $0 < x < 1$. The content of the dielectric filler in the first resin composition is 60 parts by weight or more and 85 parts by weight or less, preferably 70 parts by weight or more and 85 parts by weight or less, and more preferably 75 parts by weight or more and 85 parts by weight or less based on 100 parts by weight of the solids of the first resin composition. The particle diameter of the dielectric filler is not particularly limited, but from the viewpoint of maintaining the adhesion between the resin composition and a metal foil, the average particle diameter $D_{50}$ measured by laser diffraction scattering type particle size distribution measurement is preferably 0.01 μm or more and 2.0 μm or less, more preferably 0.05 μm or more and 1.0 μm or less, and further preferably 0.1 μm or more and 0.5 μm or less.

The second resin composition constituting the second layer 14 includes a resin component and a dielectric filler. This resin component includes an epoxy resin and a diamine compound but is free of polyimide resin. The second resin composition contributes to any of dielectric properties, circuit adhesion, voltage endurance, and interlayer insulation reliability but is particularly excellent in dielectric properties (capacitance). The second resin composition or the second layer 14 may further include any other component (excluding a polyimide resin) as long as the desired functions are not impaired.

The epoxy resin used in the second resin composition is not particularly limited as long as it has two or more epoxy groups in the molecule and can be used for electrical and electronic material applications. The preferred content of the epoxy resin in the second resin composition is 15 parts by weight or more and 85 parts by weight or less, more preferably 25 parts by weight or more and 80 parts by weight or less, and further preferably 35 parts by weight or more and 75 parts by weight or less based on 100 parts by weight of the resin component. Examples of the epoxy resin in the second resin composition include bisphenol A type epoxy resins, bisphenol F type epoxy resins, bisphenol S type epoxy resins, phenol novolac type epoxy resins, biphenyl novolac type epoxy resins, cresol novolac type epoxy resins, alicyclic epoxy resins, glycidylamine type epoxy resins, naphthalene type epoxy resins, anthracene type epoxy resins, dicyclopentadiene type epoxy resins, and any combination thereof. In terms of maintaining the heat resistance of the cured product, aromatic epoxy resins or polyfunctional epoxy resins are preferred, and bisphenol A type epoxy resins, phenol novolac type epoxy resins, naphthalene type epoxy resins, cresol novolac type epoxy resins, or biphenyl novolac type epoxy resins are more preferred.

The diamine compound used in the second resin composition is not particularly limited as long as it functions as a curing agent for the epoxy resin and has two amino groups in the molecule and can be used for electrical and electronic material applications. The preferred content of the diamine compound in the second resin composition is an amount such that the number of active hydrogen groups of the diamine compound is 0.5 or more and 1.5 or less, more preferably 0.5 or more and 1.0 or less, and further preferably 0.65 or more and 1.0 or less, based on the number of epoxy groups of the epoxy resin being 1. Here, "the number of epoxy groups of the epoxy resin" is the value obtained by dividing the mass of the solids of the epoxy resin present in the resin component by the epoxy equivalent. "The number of active hydrogen groups of the diamine compound" is the value obtained by dividing the mass of the solids of the diamine compound present in the resin component by the active hydrogen group equivalent. Examples of the diamine compound include 3,4'-diaminodiphenyl sulfide, 4,4'-diaminodiphenyl sulfide, 3,4'-diaminodiphenyl ether, 4,4'-diaminodiphenyl ether, 3,4'-diaminodiphenyl sulfone, 4,4'-diaminodiphenyl sulfone, bis[4-(4-aminophenoxy)phenyl] sulfone, bis[4-(3-aminophenoxy)phenyl] sulfone, bis(4-aminophenoxy)biphenyl, bis[4-(4-aminophenoxy)phenyl] ether, 1,4-bis(4-aminophenoxy)benzene, 1,3-bis(4-aminophenoxy)benzene, 2,2-bis[4-(4-aminophenoxy)phenyl] hexafluoropropane, 2,2-bis[4-(4-aminophenoxy)phenyl] propane, 1,3-bis(aminomethyl)cyclohexane, and any combination thereof and are preferably 4,4'-diaminodiphenyl sulfone, bis[4-(3-aminophenoxy)phenyl] sulfone, and 2,2-bis[4-(4-aminophenoxy)phenyl]propane.

In the second resin composition, the total content of the epoxy resin and the diamine compound is preferably 100 parts by weight based on 100 parts by weight of the resin component, because the second resin composition is free of polyimide resin unlike the first resin composition, and therefore the resin component is typically composed of two components, the epoxy resin and the diamine compound.

The dielectric filler used in the second resin composition is a component that provides the desired high capacitance to the resin laminate, and is a complex metal oxide including at least two selected from the group consisting of Ba, Ti, Sr, Pb, Zr, La, Ta, and Bi. Preferred examples of the complex metal oxide include particles including at least one selected from the group consisting of $BaTiO_3$, $SrTiO_3$, $Pb(Zr,Ti)O_3$, $PbLaTiO_3$, $PbLaZrO$, and $SrBi_2Ta_2O_9$, which have high capacitance and can be mixed into the second resin composition, more preferably $BaTiO_3$. $Pb(Zr,Ti)O_3$ means $Pb(Zr_xTi_{1-x})O_3$, wherein $0 \leq x \leq 1$, typically $0 < x < 1$. The content of the dielectric filler in the second resin composition is 70 parts by weight or more and 90 parts by weight or less, preferably 75 parts by weight or more and 90 parts by weight or less, and more preferably 80 parts by weight or more and 90 parts by weight or less based on 100 parts by weight of the solids of the second resin composition. The particle diameter of the dielectric filler is not particularly limited, but from the viewpoint of maintaining the adhesion between the resin composition and a metal foil, the average particle diameter $D_{50}$ measured by laser diffraction scattering type particle size distribution measurement is preferably 0.01 μm or more and 2.0 μm or less, more preferably 0.05 μm or more and 1.0 μm or less, and further preferably 0.1 μm or more and 0.5 μm or less.

The first resin composition and/or the second resin composition may further include a filler dispersing agent. By further including the filler dispersing agent, the dispersibility of the dielectric filler can be improved when a resin varnish and the dielectric filler are mixed. For the filler dispersing agent, a known one that can be used can be appropriately used, and the filler dispersing agent is not particularly limited. Examples of preferred filler dispersing agents include phosphonic acid type, cationic, carboxylic acid type, and anionic dispersing agents, which are ionic dispersing agents, and other dispersing agents such as ether type, ester type, sorbitan ester type, diester type, monoglyceride type, ethylene oxide addition type, ethylenediamine base type, and phenol type dispersing agents, which are nonionic dispersing agents. Other examples include coupling agents such as silane coupling agents, titanate coupling agents, and aluminate coupling agents.

A curing accelerator may be added to the first resin composition and/or the second resin composition in order to accelerate the curing of the resin component. Preferred examples of the curing accelerator include imidazole-based and amine-based curing accelerators. The content of the curing accelerator is preferably 0.01 parts by weight or more and 3 parts by weight or less, more preferably 0.1 parts by weight or more and 2 parts by weight or less, based on 100 parts by weight of the nonvolatile components in the resin composition from the viewpoint of the storage stability of the resin composition and the efficiency of the curing.

The imidazole-based curing accelerator is incorporated into the molecular structure as part of the epoxy resin after the curing reaction with the epoxy resin without being liberated as ions, and therefore the dielectric properties and insulation reliability of the resin layer can be made excellent. For the content of the imidazole-based curing accelerator, an amount that provides desirable curing should be appropriately determined considering various conditions such as the composition of the resin layer, and the content of the imidazole-based curing accelerator is not particularly limited. Examples of the imidazole curing accelerator include 2-undecylimidazole, 2-heptadecylimidazole, 2-ethyl-4-methylimidazole, 2-phenyl-4-methylimidazole, 1-cyanoethyl-2-undecylimidazole, 1-cyanoethyl-2-ethyl-4-methylimidazole, 2-ethyl-4-methylimidazole, 1-cyanoethyl phenylimidazole, 2-phenyl-4,5-dihydroxymethylimidazole, 2-phenyl-4-methyl hydroxymethylimidazole, 2-methylimidazole, 1,2-dimethylimidazole, 2-phenylimidazole, 1-benzyl-2-methylimidazole, 1-benzyl-2-methylimidazole, 1-benzyl-2-phenylimidazole, 1-cyanoethyl-2-methylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')-]ethyl-s-triazine, a 2,4-diamino-6-[2'-methylimidazolyl-(1')]-ethyl-s-triazine isocyanuric acid adduct, a 2-phenylimidazole isocyanuric acid adduct, 2,3-dihydro-1H-pyrrolo[1,2-a]benzimidazole, 1-dodecyl-2-methyl-3-benzylimidazolium chloride, 2-methylimidazoline, 2-phenylimidazoline, and any combination thereof. Preferred examples of the imidazole-based curing accelerator include 2-methylimidazole, 2-ethyl-4-methylimidazole, 2-phenyl-4-methylimidazole, and 2-phenyl-4-methyl-5-hydroxymethylimidazole. Among these, more preferred examples include 2-phenyl-4-methylimidazole and 2-phenyl-4-methyl-5-hydroxymethylimidazole, which are imidazole-based curing accelerators having a phenyl group, in terms of the chemical stability of the resin layer in a semi-cured (B stage) state. Among these, particularly preferred examples include 2-phenyl-4-methyl-5-hydroxymethylimidazole.

Examples of the amine-based curing accelerator include trialkylamines such as triethylamine and tributylamine, 4-dimethylaminopyridine, benzyldimethylamine, 2,4,6,-tris(dimethylaminomethyl)phenol, 1,8-diazabicyclo(5,4,0)-undecene, and any combination thereof.

Resin-Coated Metal Foil

The resin laminate of the present invention is preferably used as the resin of a resin-coated metal foil. By previously providing in the form of a resin-coated metal foil, a capacitor element and a capacitor-built-in printed wiring board can be efficiently manufactured without separately forming the resin laminate or a dielectric layer. That is, according to a preferred aspect of the present invention, there is provided a resin-coated metal foil including a metal foil and the resin laminate provided on at least one surface of the metal foil. This resin-coated metal foil may be one in which metal foils are provided on both surfaces of the resin laminate, and this configuration can correspond to a metal-clad laminate. Typically, the resin laminate is in the form of a resin layer, and a metal foil is coated with the first resin composition and/or the second resin composition constituting the resin laminate, using a gravure coating method, so that the thickness of the resin layer after drying is a predetermined value, and the first resin composition and/or the second resin composition are dried to obtain a resin-coated metal foil. The method of this coating is arbitrary, and a gravure coating method or other methods such as a die coating method or a knife coating method can be adopted. In addition, a doctor blade, a bar coater, or the like can also be used for coating.

Figure 3:
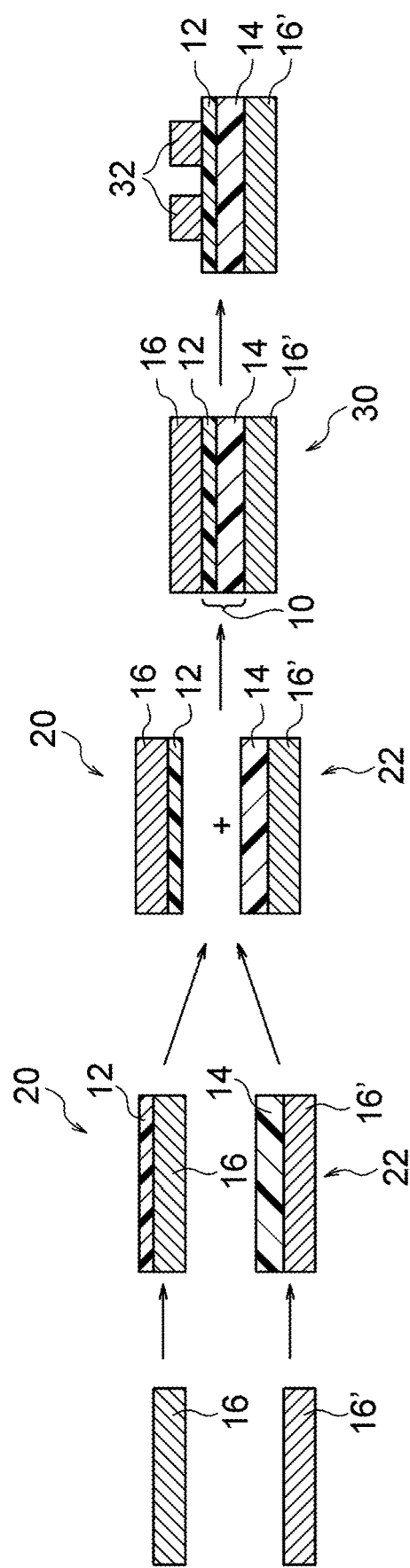
FIG. 3 is a diagram showing one example of a process for manufacturing the resin laminate shown in FIG. 1 and a resin-coated metal foil.
Figure 4:
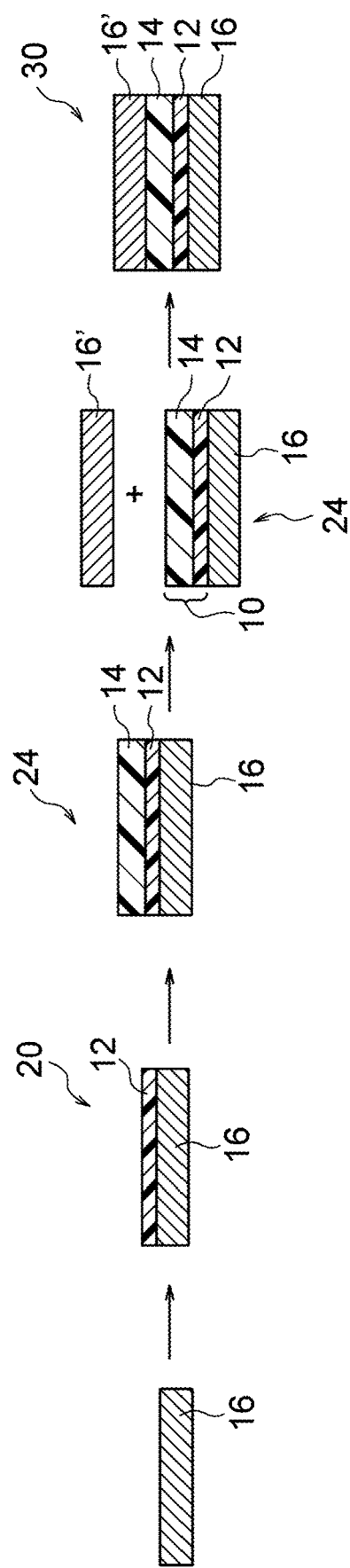
FIG. 4 is a diagram showing another example of the process for manufacturing the resin laminate shown in FIG. 1 and the resin-coated metal foil.
Figure 5:
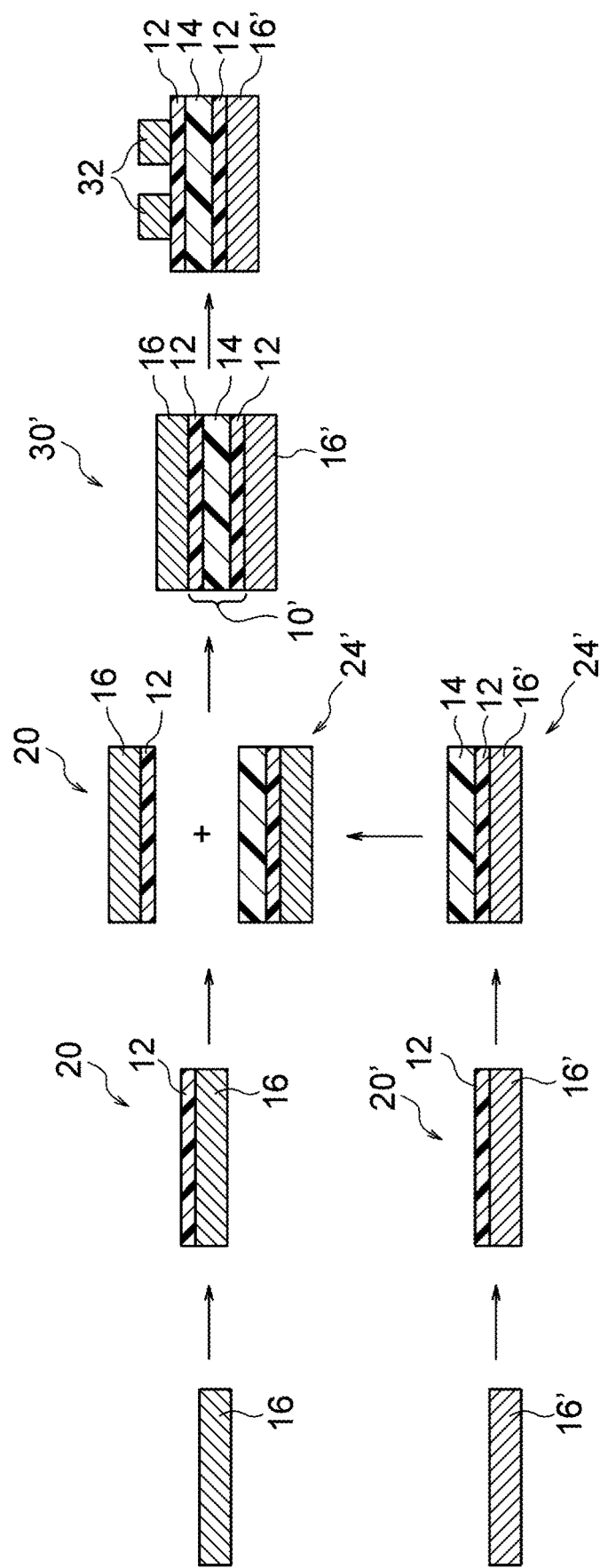
FIG. 5 is a diagram showing one example of a process for manufacturing the resin laminate shown in FIG. 2 and a resin-coated metal foil.

The lamination of the first layer 12 and the second layer 14 should be performed by any method and is not particularly limited. For example, it is possible that as shown in FIG. 3, a metal foil 16 is coated with the first resin composition to form the first layer 12 to provide a first resin-coated metal foil 20, and on the other hand, another metal foil 16' is coated with the second resin composition to form the second layer 14 to provide a second resin-coated metal foil 22, and they are bonded so that the first layer 12 and the second layer 14 face each other. It is possible that as shown in FIG. 4, a metal foil 16 is coated with the first resin composition to form the first layer 12, and then the first layer 12 is coated with the second resin composition to form the second layer 14 to provide a two-layer resin-coated metal foil 24. In this case, another metal foil 16' can be laminated on the second layer 14 to provide a metal-clad laminate 30. Alternatively, when a resin laminate having a three-layer configuration is provided, it is preferred that as shown in FIG. 5, a first resin-coated metal foil 20 in which the first layer 12 is formed on a metal foil 16, and a two-layer resin-coated metal foil 24' in which the first layer 12 and the second layer 14 are formed on another metal foil 16' be bonded so that the first layer 12 and the second layer 14 face each other. From the viewpoint of bonding resin-coated metal foils so that the first layer 12 and the second layer 14 face each other, in this manner, to form a resin laminate or a dielectric layer, the first resin composition and the second resin composition in bonding are preferably semi-cured.

The metal foil is preferably a copper foil. The metal foil such as a copper foil may be a metal foil in an electrode-posited or rolled state (so-called raw foil) or may be in the form of a surface-treated foil having at least either one surface subjected to surface treatment. The surface treatment can be various types of surface treatments performed in order to improve or provide some kind of properties (for example, rust proofing properties, moisture resistance, chemical resistance, acid resistance, heat resistance, and adhesion to a substrate) on the surface of the metal foil. The surface treatment may be performed on at least one surface of the metal foil or on both surfaces of the metal foil. Examples of the surface treatment performed on the metal foil include rust proofing treatment, silane treatment, roughening treatment, and barrier formation treatment.

The ten-point average roughness $Rz_{jis}$ on the surface of the metal foil on the resin laminate side measured in accordance with JIS B0601-2001 is preferably 2.0 µm or less, more preferably 1.5 µm or less, further preferably 1.0 µm or less, and particularly preferably 0.5 µm or less. When the ten-point average roughness $Rz_{jis}$ is within such ranges, the thickness of the resin laminate can be made thinner. The lower limit value of the ten-point average roughness Rzjis on the surface of the metal foil on the resin laminate side is not particularly limited, but from the viewpoint of the improvement of the adhesion to the resin laminate, Rzjis is preferably 0.005 μm or more, more preferably 0.01 μm or more, and further preferably 0.05 μm or more.

The thickness of the metal foil is not particularly limited but is preferably 0.1 μm or more and 100 μm or less, more preferably 0.5 μm or more and 70 μm or less, further preferably 2 μm or more and 70 μm or less, particularly preferably 10 μm or more and 70 μm or less, and most preferably 10 μm or more and 35 μm or less. In the case of the thickness within these ranges, processes such as a modified semi-additive process (MSAP), a semi-additive process (SAP), and a subtractive process, which are general pattern forming methods for the formation of the wiring of printed wiring boards, can be adopted. However, when the thickness of the metal foil is, for example, 10 μm or less, and the like, the resin-coated metal foil of the present invention may be one in which the resin laminate is formed on the metal foil surface of a carrier-attached metal foil including a release layer and a carrier for handleabililty improvement.

Dielectric Layer

The resin laminate of the present invention is preferably cured into a dielectric layer. That is, according to a preferred aspect of the present invention, there is provided a dielectric layer including the resin laminate of the present invention, wherein the first resin composition and the second resin composition are cured. The curing of the resin compositions should be performed based on a known method and is preferably performed by hot vacuum pressing. The thickness of the dielectric layer is not particularly limited as long as the desired capacitance can be ensured. The thickness of the dielectric layer is preferably 0.2 μm or more and 30 μm or less, more preferably 0.5 μm or more and 20 μm or less, particularly preferably 1 μm or more and 10 μm or less, and most preferably 2 μm or more and 6 μm or less. In the case of the thickness within these ranges, there are advantages such as easily achieving high capacitance, easily forming the resin laminate by the application of the resin compositions, easily ensuring sufficient adhesion between the resin laminate and a metal foil, and easily obtaining stable interlayer insulating properties.

Capacitor Element and Capacitor-Built-In Printed Wiring Board

The resin laminate or the dielectric layer including the same according to the present invention is preferably incorporated into a capacitor element. That is, according to a preferred aspect of the present invention, a capacitor element including the dielectric layer is provided. The configuration of the capacitor element is not particularly limited, and a known configuration can be adopted. A particularly preferred form is a capacitor-built-in printed wiring board in which a capacitor or its dielectric layer is incorporated as an inner layer portion of a printed wiring board. That is, according to a particularly preferred aspect of the present invention, a capacitor-built-in printed wiring board including the dielectric layer is provided. Particularly, by using the resin-coated metal foil of the present invention, a capacitor element and a capacitor-built-in printed wiring board can be efficiently manufactured based on known methods.

EXAMPLES

The present invention will be more specifically described by the following examples.

Example 1

(1) Preparation of Resin Varnishes

First, as raw material components for resin varnishes, the resin components and the imidazole-based curing accelerator shown below were provided.

Epoxy resin: manufactured by DIC CORPORATION, 850-S (bisphenol A type, epoxy equivalent 188 g/Eq)

Diamine compound: manufactured by Wakayama Seika Kogyo Co., Ltd., BAPP (2,2-bis[4-(4-aminophenoxy)phenyl]propane, active hydrogen group equivalent 102 g/Eq)

Polyimide resin: manufactured by Arakawa Chemical Industries, Ltd., PIAD-300 (terminal functional group: carboxyl group, solvent: mixed liquid of cyclohexanone, methylcyclohexane, and ethylene glycol dimethyl ether)

Imidazole curing accelerator: manufactured by SHIKOKU CHEMICALS CORPORATION, 2P4MHZ, (2-phenyl-4-methyl-5-hydroxymethylimidazole, based on 100 wt % of the resin component) amount added: 1.0 wt %

Two types of resin varnishes for a first resin composition and for a second resin composition were prepared as follows. The raw material components for resin varnishes were weighed in a blending ratio (weight ratio) shown in Table 1. Then, a cyclopentanone solvent was weighed, and the raw material components for resin varnishes and the cyclopentanone solvent were charged into a flask and stirred at 60° C. After it was confirmed that there were no undissolved residues of the raw materials in the resin varnish and that the resin varnish was transparent, the resin varnish was collected.

(2) Mixing with Filler

Then, the dielectric filler and the dispersing agent shown below were provided.

Dielectric filler: $BaTiO_3$, manufactured by Nippon Chemical Industrial Co., Ltd., AKBT-S (average particle diameter $D_{50}$ measured by laser diffraction scattering type particle size distribution measurement=0.3 μm)

Dispersing agent: titanate-based coupling agent, manufactured by Ajinomoto Fine-Techno Co., Inc., KR-44 (amount added: 1.5 parts by weight based on 100 parts by weight of the dielectric filler)

In order to prepare each of the first resin composition and the second resin composition, a cyclopentanone solvent, the dielectric filler, and the dispersing agent were each weighed. The weighed solvent, dielectric filler, and dispersing agent were slurried by a dispersing machine. After this slurrying was confirmed, the resin varnish for the first resin composition or for the second resin composition was weighed so that the blending ratio (weight ratio) of the final dielectric filler was as shown in Table 1, and mixed with the dielectric filler-containing slurry by the dispersing machine. After the mixing, it was confirmed that the dielectric filler did not aggregate. Thus, a coating liquid including the first resin composition and a coating liquid including the second resin composition were obtained.

(3) Resin Coating A copper foil 16 (manufactured by MITSUI MINING & SMELTING CO., LTD., thickness 18 μm, surface roughness Rzjis=0.5 μm) was coated with the first resin composition, as shown in FIG. 3, using a bar coater so that the thickness of a first layer 12 after drying was 2.0 μm, and then dried in an oven heated to 130° C. for 3 minutes to bring the resin into a semi-cured state. Thus, a first resin-coated copper foil 20 was obtained.

In the same manner, a copper foil 16' (manufactured by MITSUI MINING & SMELTING CO., LTD., thickness 18 μm, surface roughness Rzjis=0.5 μm) was coated with the second resin composition, as shown in FIG. 3, using a bar coater so that the thickness of a second layer 14 after drying was 2.0 μm, and then dried in an oven heated to 130° C. for 3 minutes to bring the resin into a semi-cured state. Thus, a second resin-coated copper foil 22 was obtained.

(4) Pressing

The first resin-coated copper foil 20 and the second resin-coated copper foil 22 were laminated so that their coating resin surfaces faced each other, as shown in FIG. 3, and vacuum-pressed at a pressure of 40 kgf/cm$^2$ and 200° C. for 90 minutes to bring the first and second resin compositions into a cured state. Thus, a metal-clad laminate 30 using copper foils was obtained which included as a dielectric layer a resin laminate 10 composed of the cured first and second resin compositions and in which the thickness of the dielectric layer was 4.0 μm.

(5) Circuit Formation and Evaluations

One surface of the obtained metal-clad laminate 30 was subjected to etching to form a circuit 32 for various types of evaluations, and the following various types of evaluations were performed.

<Evaluation 1: Peel Strength (Circuit Adhesion)>

One surface of the metal-clad laminate 30 was subjected to etching to fabricate a 3 mm wide straight circuit 32, then the circuit 32 was peeled at a peel rate of 50 mm/minute by Autograph, and the peel strength was measured. This measurement was performed in accordance with IPC-TM-650 2.4.8. The measured peel strength was evaluated according to the following criteria. The result was as shown in Table 1.

Evaluation AA: 0.7 kgf/cm or more (best)
Evaluation A: 0.6 kgf/cm or more and less than 0.7 kgf/cm (good)
Evaluation B: 0.4 kgf/cm or more and less than 0.6 kgf/cm (acceptable)
Evaluation C: less than 0.4 kgf/cm (unacceptable)

<Evaluation 2: Capacitance (Cp)>

One surface of the metal-clad laminate 30 was subjected to etching to fabricate a circular circuit having a diameter of 0.5 inches (12.6 mm), and then the capacitance at a frequency of 1 kHz was measured by an LCR meter (manufactured by HIOKI E.E. CORPORATION, LCR HiTESTER 3532-50). This measurement was performed in accordance with IPC-TM-650 2.5.2. The result was as shown in Table 1. In the applications of the present invention, a capacitance of 30 nF/in$^2$ or more is essential for having higher filter performance and therefore particularly important.

Evaluation AA: 50 nF/in$^2$ or more (best)
Evaluation A: 40 nF/in$^2$ or more and less than 50 nF/in$^2$ (good)
Evaluation B: 30 nF/in$^2$ or more and less than 40 nF/in$^2$ (acceptable)
Evaluation C: less than 30 nF/in$^2$ (unacceptable)

<Evaluation 3: Breakdown Voltage (BDV)>

One surface of the metal-clad laminate 30 was subjected to etching to fabricate a circular circuit having a diameter of 0.5 inches (12.6 mm), and then the breakdown voltage under the condition of a voltage increase rate of 80 V/sec was measured by an insulation resistance measuring instrument (manufactured by HIOKI E.E. CORPORATION, super-insulation meter SM7110). This measurement was performed in accordance with IPC-TM-650 2.5.6.2. The result was as shown in Table 1.

Evaluation AA: 100 V or more (best)
Evaluation A: 50 V or more and less than 100 V (good)
Evaluation B: 30 V or more and less than 50 V (acceptable)
Evaluation C: less than 30 V (unacceptable)

<Evaluation 4: Leakage Current>

One surface of the metal-clad laminate 30 was subjected to etching to fabricate a circular circuit having a diameter of 0.5 inches (12.6 mm), and then the leakage current under the condition of the application of 50 V was measured by an insulation resistance measuring instrument (manufactured by HIOKI E.E. CORPORATION, super-insulation meter SM7110). This measurement was performed in accordance with IPC-TM-650 2.5.7.2. The result was as shown in Table 1.

Evaluation AA: less than 10 μA (best)
Evaluation A: 10 μA or more and less than 30 μA (good)
Evaluation B: 30 μA or more and less than 50 μA (acceptable)
Evaluation C: 50 μA or more (unacceptable)

<Evaluation 5: Interlayer Insulating Properties (B-HAST)>

Both surfaces of the metal-clad laminate 30 were subjected to etching to fabricate circular circuits having a diameter of 0.5 inches (12.6 mm), then wiring was soldered to the upper electrode and the lower electrode, and the wiring was connected to a migration measurement tester. The evaluation circuits were placed in a constant temperature and humidity tank at 130° C. and 85% RH, and an applied voltage of 3 V was applied between the upper electrode and the lower electrode. At this time, the time during which an insulation resistance of $1 \times 10^5$ Ω or more was maintained was measured, and the transition of the insulation resistance value was observed. The measured interlayer insulation maintaining time and the transition of the insulation resistance value were evaluated according to the following criteria. This measurement was performed in accordance with JESD22-A110. The result was as shown in Table 1.

Evaluation AA: an insulation resistance of $1 \times 10^5$ Ω or more is maintained for 96 hours or more, and there is no deterioration of the insulation resistance (best)
Evaluation A: an insulation resistance of $1 \times 10^5$ Ω or more is maintained for 96 hours or more, but the deterioration of the insulation resistance is seen (good)
Evaluation B: an insulation resistance of $1 \times 10^5$ Ω or more is maintained for 48 hours or more and less than 96 hours (acceptable)
Evaluation C: an insulation resistance of $1 \times 10^5$ Ω or more is maintained for less than 48 hours (unacceptable)

<Overall Evaluation>

The evaluation results of the evaluations 1 to 5 were applied to the following criteria to determine the overall evaluation. The result was as shown in Table 1.

Evaluation AA: AA determinations or A determinations in all evaluations (best)
Evaluation A: there are no C determinations, but on the other hand, there is only one B determination (good)
Evaluation B: there are no C determinations, but on the other hand, there are two or more B determinations (acceptable)
Evaluation C: there is at least one C determination (unacceptable)

Example 2

Comparison

A metal-clad laminate was fabricated and evaluated in the same manner as Example 1 except that without using the second resin-coated copper foil 22, two first resin-coated copper foils 20 were laminated so that their coating resin surfaces faced each other.

Example 3

Comparison

A metal-clad laminate was fabricated and evaluated in the same manner as Example 1 except that without using the first resin-coated copper foil 20, two second resin-coated copper foils 22 were laminated so that their coating resin surfaces faced each other.

Examples 4 to 10

A metal-clad laminate was fabricated and evaluated in the same manner as Example 1 except that in the (1), the raw material components for resin varnishes were weighed in a blending ratio (weight ratio) shown in Table 2, that the (3) resin coating was performed as follows, and the (4) pressing was performed as follows.

(3') Resin Coating A copper foil 16 (manufactured by MITSUI MINING & SMELTING CO., LTD., thickness 18 μm, surface roughness Rzjis=0.5 μm) was coated with the first resin composition, as shown in FIG. 5, using a bar coater so that the thickness of a first layer 12 after drying was 1.0 μm, and then dried in an oven heated to 130° C. for 3 minutes to bring the resin into a semi-cured state. Thus, two first resin-coated copper foils 20 and 20' were fabricated.

In addition, the surface of the first layer 12 of the first resin-coated copper foil 20' was coated with the second resin composition, as shown in FIG. 5, using a bar coater so that the thickness of a second layer 14 after drying was 2.0 μm, and then dried in an oven heated to 130° C. for 3 minutes to bring the resin into a semi-cured state. Thus, a two-layer resin-coated copper foil 24' was obtained which included the first layer 12 composed of the first resin composition and the second layer 14 composed of the second resin composition in order on a copper foil 16'.

(4') Pressing

The first resin-coated copper foil 20 and the two-layer resin-coated copper foil 24' were laminated so that their coating resin surfaces faced each other, as shown in FIG. 5, and vacuum-pressed at a pressure of 40 kgf/cm$^2$ and 200° C. for 90 minutes to bring the resin compositions into a cured state. Thus, a metal-clad laminate 30' was obtained which included as a dielectric layer a resin laminate 10' composed of the cured first and second resin compositions and in which the thickness of the dielectric layer was 4.0 μm. The dielectric layer being the resin laminate 10' thus obtained has a three-layer configuration including the first layer 12 composed of the first resin composition, the second layer 14 composed of the second resin composition, and the first layer 12 composed of the first resin composition in order.

Example 11

Comparison

A metal-clad laminate was fabricated and evaluated in the same manner as Example 4 except that in the (3'), the two-layer resin-coated copper foil 24' was fabricated by laminating a polyimide film (manufactured by DU PONT-TORAY CO., LTD., Kapton®, thickness 4 μm) as the second layer 14 on the surface of the first layer 12 of the first resin-coated copper foil 20', instead of coating the surface of the first layer 12 of the first resin-coated copper foil 20' with the second resin composition.

TABLE 1

|  |  |  |  | Ex. 1 | Ex. 2* | Ex. 3* |
|---|---|---|---|---|---|---|
|  | Configuration of resin layer |  |  | Two layers | One layer | One layer |
| First resin composition | Resin component blending ratio (parts by weight based on 100 parts by weight of total amount of resin component) | Epoxy resin | 850-S | 40.0 | 40.0 | — |
|  |  | Diamine compound | BAPP | 20.0 | 20.0 | — |
|  |  | Polyimide resin | PIAD-300 | 40.0 | 40.0 | — |
|  | Dielectric filler content (parts by weight based on 100 parts by weight of solids of resin composition) |  |  | 81.0 | 81.0 | — |
| Second resin composition | Resin component blending ratio (parts by weight based on 100 parts by weight of total amount of resin component) | Epoxy resin | 850-S | 74.0 | — | 74.0 |
|  |  | Diamine compound | BAPP | 26.0 | — | 26.0 |
|  | Dielectric filler content (parts by weight based on 100 parts by weight of solids of resin composition) |  |  | 85.0 | — | 85.0 |
|  | Polyimide film |  |  | — | — | — |
| Evaluation results | Thickness of resin layer (μm) |  |  | 4.0 | 4.0 | 4.0 |
|  | Evaluation 1 | Peel strength (kgf/cm) Determination |  | 0.5 B | 0.7 AA | 0.3 C |
|  | Evaluation 2 | Capacitance @1 kHz(nF/in$^2$) Determination |  | 40 A | 28 C | 50 AA |
|  | Evaluation 3 | Breakdown voltage (V) Determination |  | 80 A | 100 AA | 70 A |
|  | Evaluation 4 | Leakage current @50 V(μA) Determination |  | 12 A | 2 AA | 69 C |
|  | Evaluation 5 | Interlayer insulating properties |  | AA | AA | C |
|  |  | Overall evaluation |  | A | C | C |

*indicates a Comparative Example.

TABLE 2

| | | | Ex. 4 | Ex. 5 | Ex. 6 | Ex. 7 | Ex. 8 | Ex. 9 | Ex. 10 | Ex. 11* |
|---|---|---|---|---|---|---|---|---|---|---|
| | Configuration of resin layer | | Three layers | Three layers | Three layers | Three layers | Three layers | Three layers | Three layers | Three layers |
| First resin composition | Resin component blending ratio (parts by weight based on 100 parts by weight of total amount of resin component) | Epoxy resin 850-S | 40.0 | 40.0 | 40.0 | 53.0 | 26.0 | 40.0 | 40.0 | 40.0 |
| | | Diamine compound BAPP | 20.0 | 20.0 | 20.0 | 27.0 | 14.0 | 20.0 | 20.0 | 20.0 |
| | | Polyimide resin PIAD-300 | 40.0 | 40.0 | 40.0 | 20.0 | 60.0 | 40.0 | 40.0 | 40.0 |
| | Dielectric filler content (parts by weight based on 100 parts by weight of solids of resin composition) | | 81.0 | 60.0 | 85.0 | 81.0 | 81.0 | 81.0 | 81.0 | 81.0 |
| Second resin composition | Resin component blending ratio (parts by weight based on 100 parts by weight of total amount of resin component) | Epoxy resin 850-S | 74.0 | 74.0 | 74.0 | 74.0 | 74.0 | 74.0 | 74.0 | — |
| | | Diamine compound BAPP | 26.0 | 26.0 | 26.0 | 26.0 | 26.0 | 26.0 | 26.0 | — |
| | Dielectric filler content (parts by weight based on 100 parts by weight of solids of resin composition) | | 85.0 | 85.0 | 85.0 | 85.0 | 85.0 | 70.0 | 90.0 | — |
| | Polyimide film | | — | — | — | — | — | — | — | Use |
| Evaluation results | Thickness of resin layer (μm) | | 4.0 | 4.0 | 4.0 | 4.0 | 4.0 | 4.0 | 4.0 | 6.0 |
| | Evaluation 1 | Peel strength (kgf/cm) Determination | 0.6 A | 0.7 AA | 0.4 B | 0.5 B | 0.7 AA | 0.6 A | 0.4 B | 0.3 C |
| | Evaluation 2 | Capacitance @1 kHz(nF/in²) Determination | 40 A | 31 B | 46 A | 42 A | 33 B | 30 B | 50 AA | 4.0 C |
| | Evaluation 3 | Breakdown voltage (V) Determination | 70 A | 200 AA | 70 A | 60 A | 100 AA | 80 A | 60 A | >1000 AA |
| | Evaluation 4 | Leakage current @50 V(μA) Determination | 13 A | 0 AA | 48 B | 42 B | 19 A | 5 AA | 40 B | 0.0 AA |
| | Evaluation 5 | Interlayer insulating properties | AA | AA | A | A | AA | AA | A | AA |
| | Overall evaluation | | AA | AA | B | B | A | A | B | C |

*indicates a Comparative Example.

The invention claimed is:

1. A resin laminate comprising a first layer composed of a first resin composition and a second layer composed of a second resin composition provided on one surface of the first layer,
wherein the first resin composition comprises
a resin component comprising an epoxy resin, a diamine compound, and a polyimide resin, and
a dielectric filler being a complex metal oxide comprising at least two selected from the group consisting of Ba, Ti, Sr, Pb, Zr, La, Ta, and Bi, in an amount of 60 parts by weight or more and 85 parts by weight or less based on 100 parts by weight of solids of the first resin composition,
wherein the content of the polyimide resin in the first resin composition is 20 parts by weight or more and 60 parts by weight or less based on 100 parts by weight of the resin component, and
wherein the second resin composition comprises
a resin component which comprises an epoxy resin and a diamine compound but is free of polyimide resin, and
a dielectric filler being a complex metal oxide comprising at least two selected from the group consisting of Ba, Ti, Sr, Pb, Zr, La, Ta, and Bi, in an amount of 70 parts by weight or more and 90 parts by weight or less based on 100 parts by weight of solids of the second resin composition.

2. The resin laminate according to claim 1, further comprising, on a surface of the second layer on a side away from the first layer, another first layer composed of the first resin composition.

3. The resin laminate according to claim 1, wherein in the first resin composition, the total content of the epoxy resin and the diamine compound is 40 parts by weight or more and 80 parts by weight or less based on 100 parts by weight of the resin component.

4. The resin laminate according to claim 1, wherein in the first resin composition, the content of the diamine compound is an amount such that a number of active hydrogen groups of the diamine compound is 0.5 or more and 1.5 or less based on a number of epoxy groups of the epoxy resin being 1.

5. The resin laminate according to claim 1, wherein in the first resin composition, the content of the diamine compound is an amount such that a number of active hydrogen groups of the diamine compound is 0.65 or more and 1.0 or less based on a number of epoxy groups of the epoxy resin being 1.

6. The resin laminate according to claim 1, wherein the complex metal oxide included in the first resin composition comprises at least one selected from the group consisting of $BaTiO_3$, $SrTiO_3$, $Pb(Zr,Ti)O_3$, $PbLaTiO_3$, $PbLaZrO$, and $SrBi_2Ta_2O_9$.

7. The resin laminate according to claim 1, wherein the complex metal oxide included in the first resin composition is $BaTiO_3$.

8. The resin laminate according to claim 1, wherein in the second resin composition, the content of the diamine compound is an amount such that a number of active hydrogen groups of the diamine compound is 0.5 or more and 1.5 or less based on a number of epoxy groups of the epoxy resin being 1.

9. The resin laminate according to claim 1, wherein in the second resin composition, the content of the diamine compound is an amount such that a number of active hydrogen groups of the diamine compound is 0.65 or more and 1.0 or less based on a number of epoxy groups of the epoxy resin being 1.

10. The resin laminate according to claim 1, wherein the complex metal oxide included in the second resin composition comprises at least one selected from the group consisting of $BaTiO_3$, $SrTiO_3$, $Pb(Zr,Ti)O_3$, $PbLaTiO_3$, $PbLaZrO$, and $SrBi_2Ta_2O_9$.

11. The resin laminate according to claim 1, wherein the complex metal oxide included in the second resin composition is $BaTiO_3$.

12. A dielectric layer comprising the resin laminate according to claim 1, wherein the first resin composition and the second resin composition are cured.

13. The dielectric layer according to claim 12, wherein the dielectric layer has a thickness of 0.2 μm or more and 30 μm or less.

14. A resin-coated metal foil comprising a metal foil and the resin laminate according to claim 1 provided on at least one surface of the metal foil.

15. The resin-coated metal foil according to claim 14, wherein the metal foil is provided on both surfaces of the resin laminate.

16. The resin-coated metal foil according to claim 14, wherein the metal foil is a copper foil.

17. A capacitor element comprising the dielectric layer according to claim 12.

18. A capacitor-built-in printed wiring board comprising the dielectric layer according to claim 12.

* * * * *